(12) United States Patent
Albasini et al.

(10) Patent No.: US 7,826,246 B2
(45) Date of Patent: Nov. 2, 2010

(54) READING CIRCUIT AND METHOD IN A DATA-STORAGE SYSTEM

(75) Inventors: Guido Albasini, Voghera (IT); Michele Fedeli, Pavia (IT); Mattia Introini, Pavia (IT); Maurizio Zuffada, Cornaredo (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 272 days.

(21) Appl. No.: 12/008,976

(22) Filed: Jan. 14, 2008

(65) Prior Publication Data

US 2009/0040806 A1   Feb. 12, 2009

(30) Foreign Application Priority Data

Jan. 12, 2007   (EP) .................. 07425012

(51) Int. Cl.
*G11C 11/24* (2006.01)
*G11C 7/00* (2006.01)
*G11C 7/02* (2006.01)

(52) U.S. Cl. .......... 365/145; 365/189.15; 365/205; 365/207

(58) Field of Classification Search .......... 365/145, 365/205, 207
See application file for complete search history.

(56) References Cited

U.S. PATENT DOCUMENTS

| | | | |
|---|---|---|---|
| 4,565,971 A | 1/1986 | Brookshire | |
| 2002/0174715 A1* | 11/2002 | Kim et al. | 73/105 |
| 2003/0021143 A1 | 1/2003 | Nair | |
| 2003/0103386 A1 | 6/2003 | Karlsson et al. | |
| 2003/0137865 A1 | 7/2003 | Thompson et al. | |
| 2003/0227809 A1 | 12/2003 | Schwartz | |
| 2004/0095823 A1* | 5/2004 | Tam | 365/205 |
| 2004/0164771 A1* | 8/2004 | Martin et al. | 327/52 |
| 2005/0180220 A1 | 8/2005 | Chen | |
| 2005/0195300 A1* | 9/2005 | Krymski | 348/294 |
| 2006/0023606 A1 | 2/2006 | Lutwyche | |
| 2006/0062042 A1* | 3/2006 | Karlsson et al. | 365/145 |
| 2006/0087875 A1* | 4/2006 | Lueker et al. | 365/145 |
| 2008/0055960 A1* | 3/2008 | Morita et al. | 365/145 |

(Continued)

FOREIGN PATENT DOCUMENTS

EP         0712135        5/1996

(Continued)

OTHER PUBLICATIONS

EP Search Report, May 22, 2007.

(Continued)

*Primary Examiner*—Ly D Pham
(74) *Attorney, Agent, or Firm*—Lisa K. Jorgenson; Kevin D. Jablonski; Graybeal Jackson LLP

(57) ABSTRACT

A reading circuit for reading a datum stored in a storage material. In the reading circuit, a generating stage generates a read electrical quantity to be applied to the storage material, and a sensing stage is configured to generate an output electrical quantity that is indicative of a charge variation associated to the datum stored, and that occurs in the storage material due to application of the read electrical quantity; in particular, the sensing stage uses a charge-sensing amplifier electrically connected to the storage material.

25 Claims, 3 Drawing Sheets

U.S. PATENT DOCUMENTS

2008/0170488 A1 * 7/2008 Zuffada et al. .............. 369/126

FOREIGN PATENT DOCUMENTS

| EP | 1376603 A | 1/2004 |
|---|---|---|
| WO | 0205287 | 1/2002 |
| WO | 0205288 | 1/2002 |
| WO | WO 2006/033581 | 3/2006 |

OTHER PUBLICATIONS

International Search Report for International Application No. PCT/NO2005/000347, dated Jan. 19, 2006, conducted by the Swedish Patent Office.

* cited by examiner

READING CIRCUIT AND METHOD IN A DATA-STORAGE SYSTEM

PRIORITY CLAIM

This application claims priority from European patent application No. 07425012.7, filed Jan. 12, 2007, which is incorporated herein by reference.

TECHNICAL FIELD

An embodiment of the present invention relates to a reading circuit and method in a data-storage system, in particular for ferro-electric material storage media, to which reference will be made in the ensuing treatment, without this implying any loss of generality.

BACKGROUND

As is known, in the field of storage systems there is a need to reach high storage capacities with a high data-transfer rate (bit rate) and a low error rate (bit-error rate), at the same time reducing manufacturing costs and area occupation.

Storage systems currently used are hard-disk drives (with miniaturized dimensions) and flash RAMs. In hard disks, a ferromagnetic material is used for storing the information in the form of bits, the state of magnetization of each cell determining the value of the bit stored.

These storage systems have intrinsic technological limits as regards the increase in the data-storage capacity and read/write speed, and the reduction of their dimensions. For example, in the case of hard disks, the so-called "superparamagnetic limit" hinders reduction in the dimensions of the magnetic-storage domains below a critical threshold.

Amongst the innovative solutions proposed, promising ones are storage systems using a storage medium made of ferro-electric material, in which reading/writing of individual bits is performed by interacting with the ferro-electric domains of the ferro-electric material. As is known, a ferro-electric material has a spontaneous polarization, which can be reversed by an applied electrical field. As illustrated in FIG. 1, this material has a hysteresis cycle in the diagram of the polarization charge Q (or, equivalently, of the polarization P) versus the applied voltage V. By exploiting this hysteresis cycle, it is possible to store the information in the form of bits. Without a polarization voltage imparted to the medium (V=0), two points of the diagram (designated by "b" and "e") are in a stable-state and have different polarization, namely, of equal and opposite values. These points can remain in the stable state even for some years, thus maintaining the stored binary datum (for example, the point "b", with positive charge $+Q_H$, corresponds to a "0", whilst the point "e", with negative charge $-Q_H$, corresponds to a "1").

Reading circuits used in current data-storage systems, whether these are based on ferromagnetic or ferro-electric material (or other type of material), generally envisages the use of a transimpedance amplifier (TIA) for detecting an input current signal associated with the stored datum, and amplifying and converting it into an output voltage signal (to be used for subsequent processing). For example, in the case of ferromagnetic media, the input current signal is generated by an inductive sensor and is variable according to the magnetic field detected (and thus according to the stored datum); in more recent architectures, the input current signal is a function of the resistance of a read head moving over the medium, which again varies with the magnetic field. In the case of ferro-electric media, the input current signal is due to a variation of charge occurring in the ferro-electric material when a read voltage having a value higher than a threshold voltage is applied (known as coercive voltage, characteristic of the material, and designated by $V_c$ in FIG. 1).

In detail, FIG. 2 shows a reading circuit 1, of a known type, coupled to a ferro-electric storage medium, represented schematically as a ferro-electric capacitor 2 with charge that varies according to the polarization condition (and thus to the stored datum), and having a first terminal 2a, connected to a reference potential (for example, to the ground of the circuit), and a second terminal 2b. The reading circuit 1 comprises: a voltage generator 3, configured to generate a read signal $V_r$; a transimpedance-amplifier stage 4 (of a known type, and not described in detail), connected to the ferro-electric capacitor 2 and to the voltage generator 3, and configured to detect and process a current signal caused by a charge variation $\Delta Q$ occurring in the ferro-electric material when the read signal $V_r$ is applied; and a filtering stage 5 (of a known type, and not described in detail) connected to the output of the transimpedance-amplifier stage 4, and issuing an output signal (for example, an output-voltage signal $V_{out}$) as a function of the charge variation $\Delta Q$.

The circuit described enables detection of the stored information: in particular, by applying the read voltage $V_r$, the capacitance of the ferro-electric capacitor 2 charges or discharges according to the previously stored information, and a correlated current flows between the storage medium and the reading circuit 1. The current is converted into voltage by the transimpedance amplifier, and processing of the output-voltage signal $V_{out}$ thus generated (by an appropriate processing circuit, not illustrated) enables the determination of the value of the stored datum.

However, the circuit arrangement of the transimpedance amplifier (in particular, the presence of an RC group) limits the bandwidth of the reading circuit and consequently the data-transfer rate that can be achieved in reading and writing. In addition, the presence of passive components (e.g., a resistor) limits the performance of the reading circuit in terms of noise and power consumption, given that the bit-error rate depends in a known way on the signal-to-noise ratio.

SUMMARY

An embodiment of the present invention is to provide a reading circuit and method that are improvements over the known art, and in particular enable the aforementioned problems and disadvantages to be solved.

According to an embodiment of the present invention, a reading circuit and method for a data-storage system are consequently provided.

BRIEF DESCRIPTION OF THE DRAWINGS

One or more embodiments of the invention are now described, purely by way of non-limiting example and with reference to the attached drawings, wherein.

DETAILED DESCRIPTION

As will be clarified in what follows, one embodiment of the present invention envisages the use of a charge-sensing-amplifier (CSA) stage in the reading circuit coupled to a data-storage medium (for example, a ferro-electric material storage medium).

Figure 3:
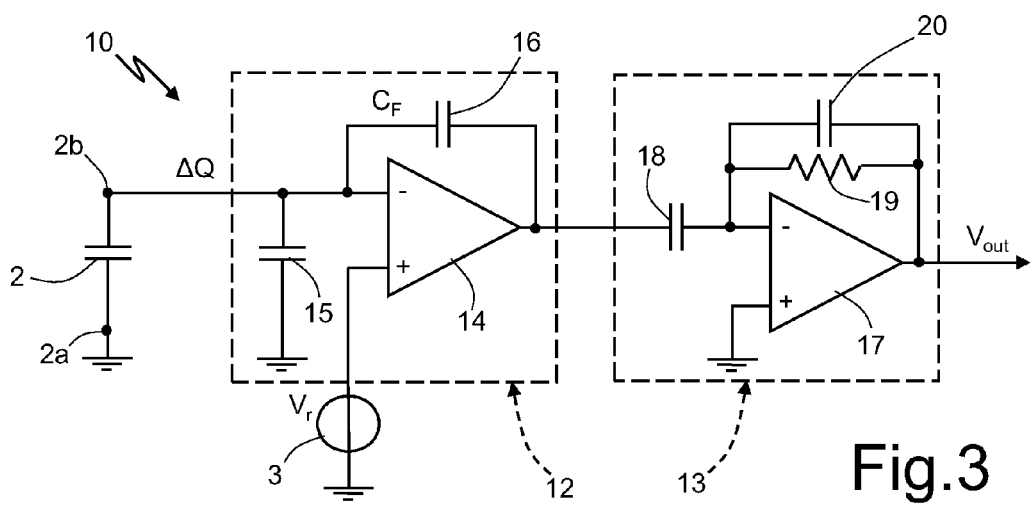
FIG. 3 shows a circuit block diagram of a reading circuit according to one embodiment of the present invention.

In detail, and as illustrated in FIG. 3 (where parts that are similar to others described previously are designated by the same reference numbers), a reading circuit 10 for a ferro-electric storage medium, again represented schematically as a ferro-electric capacitor 2 having a first terminal 2a connected to a reference potential and a second terminal 2b, comprises: a voltage generator 3, generating a read signal $V_r$; a CSA stage 12, connected to the ferro-electric capacitor 2 and to the voltage generator 3, and configured to detect and process a charge variation $\Delta Q$ occurring in the ferro-electric material when the read signal $V_r$ is applied; and a filtering stage 13 (that may possibly not be present), connected to the output of the CSA stage 12, and issuing an output-voltage signal $V_{out}$ as a function of the charge variation $\Delta Q$, which can be processed by suitable processing circuits (not illustrated herein).

In greater detail, the CSA stage 12 comprises: an operational amplifier 14 having a non-inverting input connected to the voltage generator 3 and receiving the read signal $V_r$, an inverting input connected to the second terminal 2b of the ferro-electric capacitor 2, so that the terminal 2b receives the read signal $V_r$ due to the known "virtual short circuit" principle, and an output terminal, connected to a filtering stage 13; a parasitic capacitor 15, connected between the inverting input of the operational amplifier 14 and the reference potential; and a feedback capacitor $C_f$ 16, feedback-connected between the output terminal and the inverting input of the operational amplifier 14. In particular, the parasitic capacitor 15 is a resultant parasitic capacitance on the inverting input of the operational amplifier 14 (as is known, due to the electrical connections, the input components of the amplifier, etc.).

The filtering stage 13 for suppression of noise (e.g., an NSF ((noise-shaping filter))) comprises: a respective operational amplifier 17, having its non-inverting input connected to a respective reference potential (not necessarily at the same potential as that of the first terminal 2a), its inverting input connected to the output of the CSA stage 12 via the interposition of a first capacitor 18, and an output issuing the output-voltage signal $V_{out}$; as well as a feedback resistor 19 and a second capacitor 20 connected in parallel between the output and the inverting input of the respective operational amplifier 17.

As is known, the CSA outputs a voltage linearly correlated to the quantity of charge that it receives at its input, which in this case is indicative of the information bit in the memory, thus enabling reading of the stored data. In particular, the described reading circuit detects directly the variation of charge stored in the storage medium, and not the current flowing from/to the storage medium. Thus, a reading following more closely the actual behavior of the storage system is provided, which may be more reliable and precise (in particular for small amplitude charge variations) than the reading generated by prior circuits.

Figure 2:
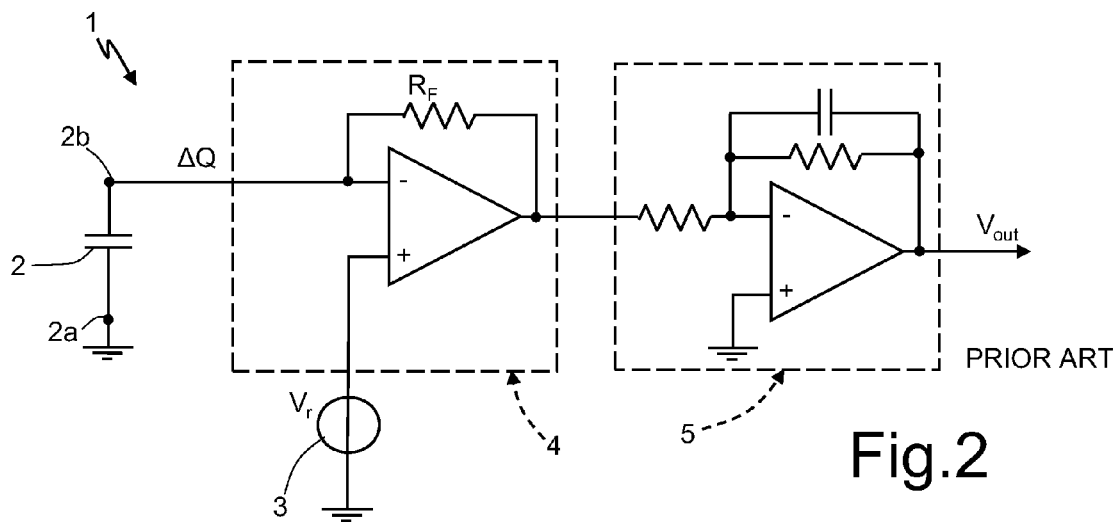
FIG. 2 shows a circuit block diagram of a reading circuit of a known type for a ferro-electric material storage medium.
Figure 4:
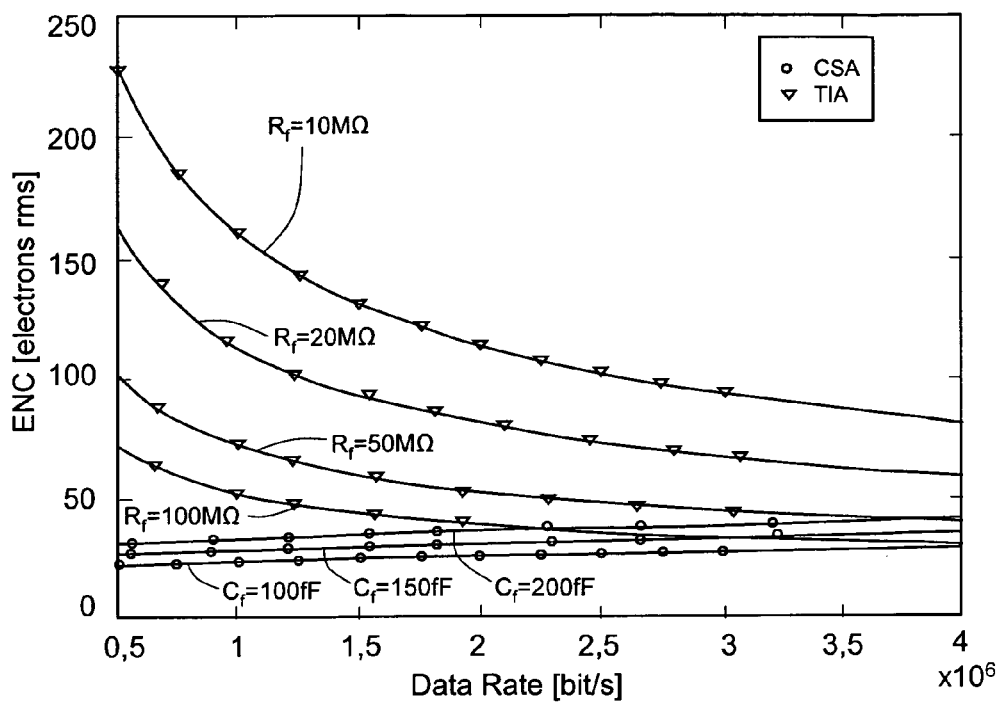
FIG. 4 shows a comparative graph of the noise performance of the circuits of FIGS. 2 and 3 according to an embodiment of the invention.

Tests (FIG. 4) have shown that the use of a charge-sensing amplifier in the reading circuit 10 enables noise performance—measured in terms of equivalent noise-charge (ENC) number—to be obtained that is considerably better than that of traditional circuits using transimpedance amplifiers. The improvement in terms of noise is highlighted for various values of feedback resistance $R_f$ of the transimpedance amplifier (FIG. 2) and of feedback capacitance $C_f$ of the charge-sensing amplifier (FIG. 3): in particular, the improvement is greater when compared with low values of feedback resistance $R_f$ and for low values of data-transfer rate. The lower noise of the reading circuit according to an embodiment the present invention is theorized to be due to the absence of passive components in the amplification stage (only reactive components are present), and to the fact that the bandwidth is limited mainly by the frequency characteristics of the operational amplifier being used.

Figure 5:
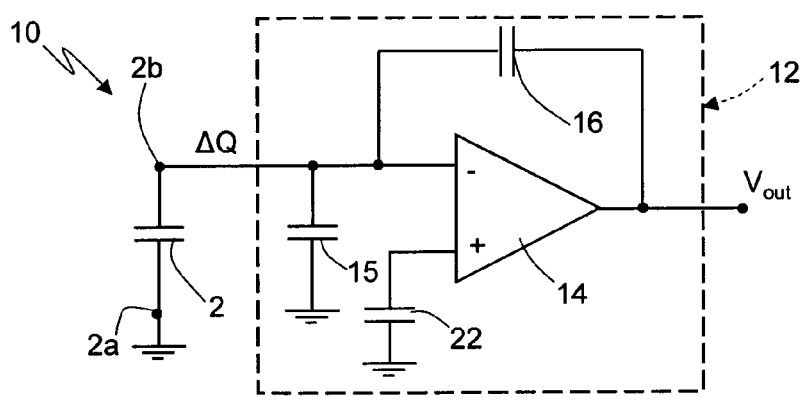
FIG. 5 shows part of a reading circuit according to a further embodiment of the present invention.

FIG. 5 shows another embodiment of the CSA stage 12 (the voltage generator 3, which in this case is not illustrated, can be connected during non-reading periods for carrying out a pre-charge for biasing the second terminal 2b and the non-inverting input of the operational amplifier 14).

In particular, a matching capacitor 22 is in this case connected between the reference potential and the non-inverting terminal of the operational amplifier 14. The capacitance value of the matching capacitor 22 is chosen so as to be as close as possible to the sum of the capacitance of the parasitic capacitor 15 and that of the ferro-electric capacitor 2, so as to balance the impedances of the inverting and non-inverting inputs of the operational amplifier 14 (for example, the value of this capacitance may consequently be of the order of hundreds of fF). In this way, it may be possible to match the inputs of the operational amplifier, reducing noise due to unbalancing of these inputs, and to further improve the performance of the reading circuit 10.

In addition, the capacitance value of the parasitic capacitor 15 can be chosen so as to be substantially equal to the capacitance of the ferro-electric capacitor 2 (due to the ferro-electric storage medium and to an associated read head) so as to further improve the performance of the circuit thanks to a better compromise between "1/f noise" and "white noise" of the operational amplifier. Alternatively, a capacitor (not shown) may be placed in parallel with the parasitic capacitance 15 to provide a desired value of capacitance between the reference voltage and the non-inverting input of the operational amplifier 14.

Figure 6:
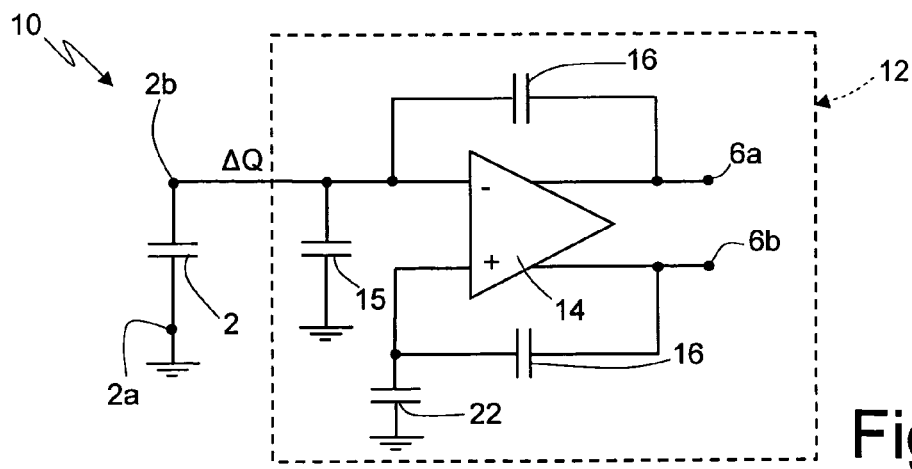
FIGS. 6 and 7 show possible variants of the circuit of FIG. 5 according to an embodiment of the invention.

The CSA stage 12 can be further modified with the adoption of a differential architecture, substantially as illustrated in FIG. 6. In this case, the operational amplifier 14 has a positive output 6a and a negative output 6b, connected, respectively, via respective feedback capacitors 16, to the inverting input and to the non-inverting input of the operational amplifier 14. This configuration enables reduction, in a per se known manner, of the common-mode noise of the operational amplifier 14.

Figure 7:
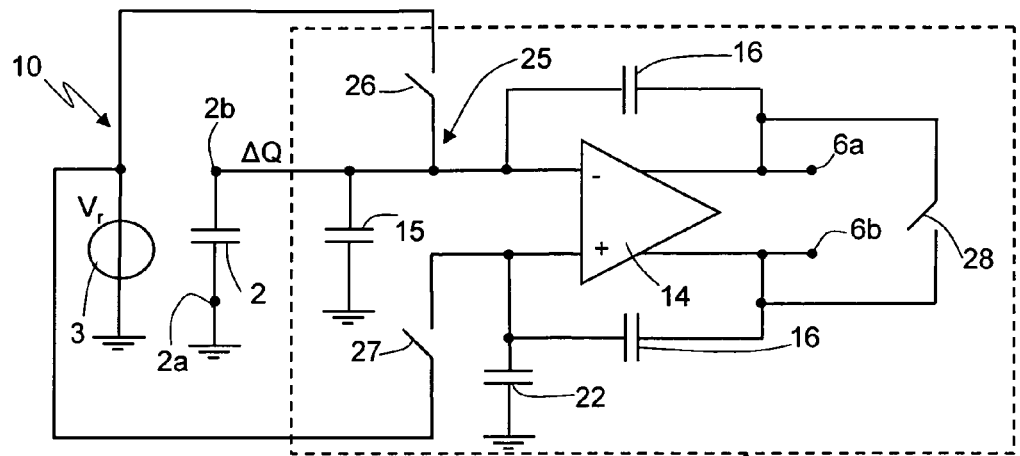

According to a further embodiment of the present invention, the reading circuit 10 comprises (see FIG. 7, which relates, by way of example, to the differential architecture just described), a reset stage 25 to enable periodic discharging of the feedback capacitors 16 and to thus prevent saturation of the operational amplifier 14. In detail, the reset stage 25 comprises: a first switch 26 and a second switch 27, connected, respectively, between the inverting input and the non-inverting input of the operational amplifier 14, and the voltage generator 3; and a third switch 28, connecting together the positive and negative outputs 6a, 6b of the operational amplifier 14. The switches 26-28 are normally open during operation of the reading circuit 10, and are closed at pre-set time intervals, for example approximately every thousand bits read, by an appropriate control circuit (not illustrated) to enable resetting of the reading circuit. In particular, by setting the switches 26-28 in the closing condition, it is possible to cause discharge of the feedback capacitors 16, zeroing the differential signal and maintaining the common-mode biasing.

From what has been described and illustrated above, the advantages that the reading circuit according to an embodiment of the invention enables are evident.

In particular, the fact is again emphasized that the use of a charge-sensing amplifier (so far used in completely different applications, such as, for example, detection of nuclear particles) in the reading circuit of a storage system enables improvement in terms of its noise performance, rendering it particularly suited for innovative storage systems, which require even smaller input variations (in particular charge variations) to be appreciated during reading of the stored data.

Figure 1:
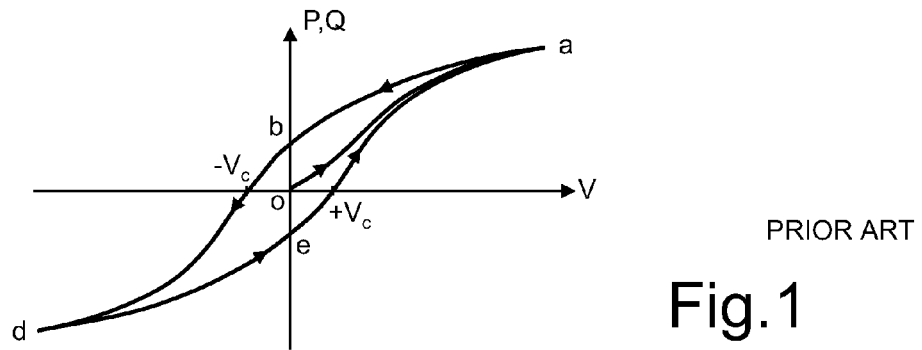
FIG. 1 shows a diagram of a hysteresis cycle of a storage medium ferro-electric material.

In this regard, the described reading circuit is particularly advantageous in combination with a new non-destructive reading technique of the data stored in a ferro-electric storage medium. This technique is based on the asymmetrical behavior of the ferro-electric material around its two stable states (points "b" and "e" of the diagram of FIG. 1). In particular, this technique envisages applying to the ferro-electric material a low-voltage read signal (with an amplitude much smaller than that of the coercive voltage $V_c$), and determining the variation of charge (or, equivalently, of polarization) occurring in the ferro-electric material in dynamic conditions, during application of the read signal. The charge variation in the material differs according to the stored datum (and so to the stable state previously reached by the material) in so far as the behavior of the hysteresis diagram near the stable state differs. As is evident from FIG. 1, the slope of the hysteresis diagram around the two stable states is different; namely, for negative read voltages it is greater for a positive starting polarization $+Q_H$ than for the negative polarization $-Q_H$ (and consequently causes a greater variation of charge), whereas for positive read voltages it is greater for a negative starting polarization $-Q_H$ than for the positive polarization $+Q_H$. From the amount of the charge variation (which differs according to the starting polarization of the ferro-electric material), it is possible to determine the stored datum, without the read operation causing cancellation thereof. Given that a read voltage of a very low value is used, the amount of the variation of charge is reduced and is difficult to be detected by traditional reading circuits. Hence, this may be an advantage of using the reading circuit 10 previously described.

Figure 8:
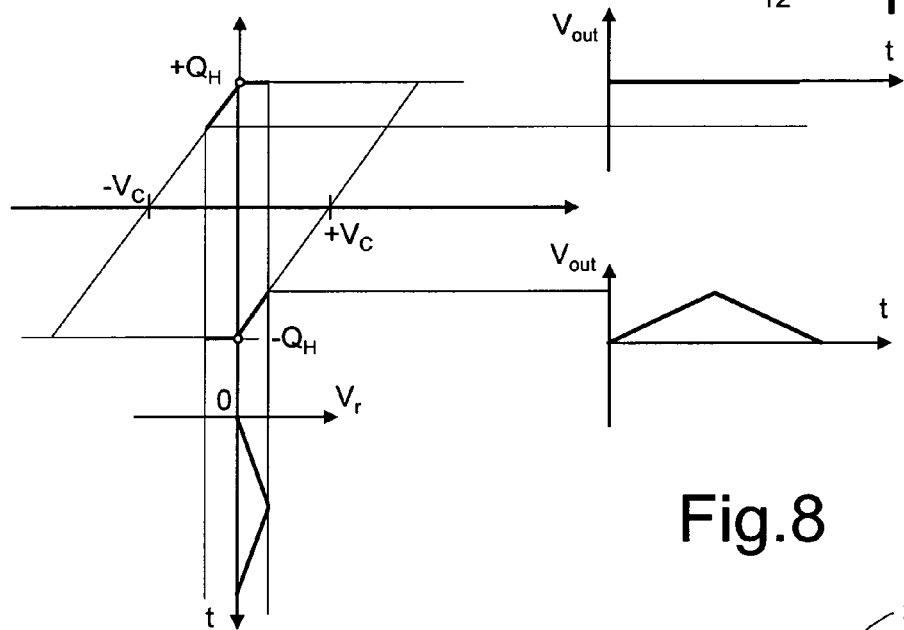
FIG. 8 shows a plot of electrical quantities in the reading circuit according to an embodiment of the invention.

The operating principle of this read technique is described with reference to FIG. 8 according to an embodiment of the invention, where, for clarity of illustration, the hysteresis cycle of the ferro-electric material is simplified and modelled as a series of straight lines (so as to highlight the difference of slope around the two stable states). Due to application of the read signal $V_r$, for example of a triangular type and positive value (and in any case smaller than the coercive voltage $V_c$ of the ferro-electric material), the polarization moves along the main hysteresis cycle: if the material has a negative starting polarization $-Q_H$, a variation of the charge stored in the ferro-electric material occurs resulting in a variation of the output-voltage signal $V_{out}$; instead, if the material has a positive starting polarization $+Q_H$, ideally no appreciable variation of the charge stored, and consequently of the output-voltage signal $V_{out}$, occurs. Since the read voltage $V_r$ is smaller than the coercive voltage $V_c$, the polarization returns to the starting stable state after the application of the read pulse. If a negative read pulse is applied, a result complementary to the one previously described is obtained, with a non-zero output signal $V_{out}$ for a positive polarization $+Q_H$, and an ideally zero output signal for a negative polarization $-Q_H$. In addition, even if a real hysteresis cycle were considered, on account of the different slopes of the polarization diagram according to the starting stable state, a positive read voltage would in any case cause a charge variation significantly greater in the case of a starting stable state with negative polarization than in the case of a starting stable state with positive polarization (the reverse for a negative read voltage). The different charge variation can then be detected by an appropriate analysis circuit for determining the datum stored in the memory.

Possibly, to enable a better analysis of the output signal $V_{out}$, a correlation between the same output signal and the read signal $V_r$ can be made so as to obtain an output with a non-zero mean value (once again only for one of the two stable states, the other originating an ideally zero signal); for example, a rectifier circuit or multiplexer can be used for the purpose. In addition, it is evident that the read stimulus can have other shapes, for example, sinusoidal or square-wave, and be periodic or else impulsive (tipically always with an amplitude smaller than the coercive voltage of the ferro-electric material).

The reading circuit and the reading method described maybe particularly advantageous for storage systems of the so-called "probe storage" type (also referred to as "atomic-storage systems"). These systems enable high data-storage capacities to be reached with reduced dimensions and with low manufacturing costs.

By way of example (see FIG. 9), a "probe storage" system 31 comprises a two-dimensional array of interaction structures (or probes) 32 fixed to a common substrate 33, for example made of silicon, provided in which is a control electronics, for example made with CMOS technology. In particular, the control electronics comprise the reading circuit 10 and an associated analysis circuit 10a, for detection and determination of the bits read. The array is arranged on a storage medium 34 made of ferro-electric material, and is mobile relative to the storage medium, generally in a first and in a second direction x, y orthogonal to one another, due to the operation of a micromotor (not illustrated). Each interaction structure 32 comprises: a carrying element 35 made of semiconductor material, in particular silicon (generally known as "cantilever" or "cantilever beam"), suspended in cantilever fashion above the storage medium 34 and free to move in a third direction z, orthogonal to the first and second direction x, y so as to approach the storage medium 34; and an interaction element 36 (referred to also as "sensor" or "contact element"), made of conductive material, carried by the carrying element 35 at a free end thereof, and facing the storage medium 34 (where by the term "interaction" is meant any operation of read, write or erasure of one or more information bits, which implies an exchange of signals between the interaction structure 32 and the storage medium 34). Via the respective interaction element 36, which may have nanometric dimensions, each interaction structure 32 is able to interact locally at an atomic level with a portion of the storage medium 34 in order to write, read, or erase information bits.

In detail, during a read operation, an electrode 38 arranged underneath, and in contact with, the storage medium 34 is set to a reference voltage (thus being the first terminal 2a of the ferro-electric capacitor 2), and the read voltage $V_r$ is applied to the interaction element 36 (which is, instead, the second terminal 2b of the same ferro-electric capacitor 2). The charge variation in the ferro-electric material is then detected by the reading circuit 10 and analysed by the analysis circuit 10a, for example integrated in the substrate 33, for determining the read data, for example based on the above described non-destructive technique.

Finally, modifications and variations may be made to what is described and illustrated herein, without thereby departing from the spirit and scope of the present invention.

In particular, it is evident that further circuit variants can be used for the charge-sensing amplifier with respect to the ones described previously, for detecting and amplifying the variation of charge in the storage material, which is indicative of the stored datum. For example, the switches 26, 27 could be used also for connecting the voltage generator 3 to the CSA stage 12 and carrying out the aforementioned precharging operation.

The reading circuit and method described can be applied in various storage systems based on ferro-electric materials, for example in ferro-electric RAMs (FeRAMs) comprising a plurality of memory cells including ferro-electric material.

Figure 9:
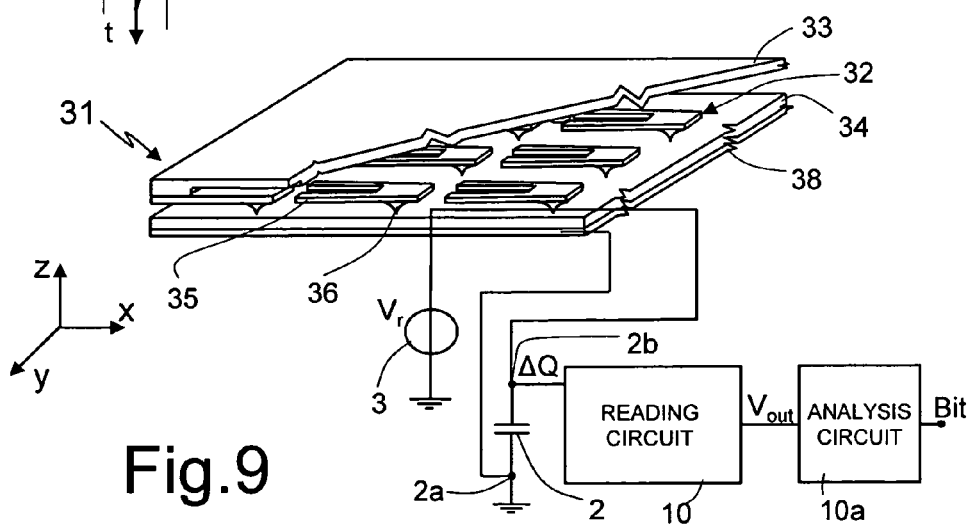
FIG. 9 is a schematic representation of a ferro-electric storage system, comprising a reading circuit according to an embodiment of the invention.

Furthermore, the probe storage system 31 of FIG. 9 may be part of a larger system such as a computer system.

What is claimed is:

1. A read circuit for reading data stored in a memory cell, the read circuit comprising:
   a reference node;
   a first input node operable to be coupled to the memory cell;
   a second input node operable to receive a read signal;
   a first output node operable to provide a first data signal;
   a first capacitance coupled between the first output node and the first input node;
   a second capacitance coupled between the second input node and the reference node; and
   wherein the second capacitance has a value that is approximately equal to a sum of a value of the second capacitance and a capacitance of the memory cell.

2. The read circuit of claim 1 wherein the first capacitance comprises a capacitor.

3. The read circuit of claim 1 wherein the first capacitance is coupled between the output node and the first input node.

4. The read circuit of claim 1, further comprising an operational amplifier having an inverting input node coupled to the first input node, a non-inverting input node coupled to the second input node, and a second output node coupled to the first output node.

5. The read circuit of claim 1 wherein the read signal comprises a read voltage.

6. The read circuit of claim 1, further comprising a generator coupled to the second input node and operable to generate the read signal.

7. The read circuit of claim 1, further comprising:
   wherein the first capacitance is coupled between the output node and the first input node;
   a reference node; and
   a second capacitance coupled between the first input node and the reference node.

8. The read circuit of claim 1, further comprising:
   wherein the first capacitance is coupled between the first output node and the first input node;
   a reference node; and
   a parasitic second capacitance coupled between the first input node and the reference node.

9. The read circuit of claim 1, further comprising:
   a reference node; and
   a second capacitance coupled between the second input node and the reference node.

10. The read circuit of claim 1, further comprising:
    wherein the first capacitance is coupled between the first output node and the first input node;
    a second output node operable to provide a second data signal such that a difference between the first and second data signals represents a value of the data stored in the memory cell; and
    a second capacitance coupled between the second output node and the second input node.

11. The read circuit of claim 1, further comprising a filter coupled to the first output node.

12. A read circuit for reading data stored in a memory cell, the read circuit comprising:
    a first input node operable to be coupled to the memory cell;
    a second input node operable to receive a read signal;
    a first output node operable to provide a first data signal; and
    a first capacitance coupled between the first output node and one of the first and second input nodes;
    wherein the first capacitance is coupled between the first output node and the first input node;
    a second output node operable to provide a second data signal such that a difference between the first and second data signals represents a value of the data stored in the memory cell;
    a second capacitance coupled between the second output node and the second input node; and
    a switch coupled between the first and second output nodes.

13. A read circuit for reading data stored in a memory cell, the read circuit comprising:
    a first input node operable to be coupled to the memory cell;
    a second input node operable to receive a read signal;
    a first output node operable to provide a first data signal; and
    a first capacitance coupled between the first output node and one of the first and second input nodes;
    wherein the first capacitance is coupled between the first output node and the first input node;
    a second output node operable to provide a second data signal such that a difference between the first and second data signals represents a value of the data stored in the memory cell;
    a second capacitance coupled between the second output node and the second input node; and
    a switch circuit operable to couple together the first and second output nodes and to couple together the first and second input nodes.

14. An integrated circuit, comprising:
    a memory cell operable to store data;
    a selector circuit operable to couple the memory cell to the read circuit; and
    a read circuit for reading the data stored in the memory cell, the read circuit comprising
        a generator operable to generate a read signal,
        a first input node coupled to the selector circuit,
        a second input node coupled to the generator,
        a first output node operable to provide a first data signal, and
        a first capacitance coupled between the first output node and the first input node
    a second capacitance coupled between the second input node and a reference node.

15. The integrated circuit of claim 14 wherein the memory cell comprises a ferro-electric material.

16. The integrated circuit of claim 14, further comprising:
a reference node; and
wherein the memory cell comprises a first electrode coupled to the reference node,
a ferro-electric material disposed over the first electrode,
a second electrode that is coupled to the selector circuit and that has an element that is moveable over the ferro-electric material.

17. A system, comprising:
a first integrated circuit comprising
 a memory cell operable to store data,
 a selector circuit operable to couple the memory cell to the read circuit, and
 a read circuit for reading the data stored in the memory cell, the read circuit comprising
 a generator operable to generate a read signal,
 a first input node coupled to the selector circuit,
 a second input node coupled to the generator,
 a first output node operable to provide a first data signal, and
 a first capacitance coupled between the first output node and the first input node;
 a second capacitance coupled between the second input node and a reference node; and
a second integrated circuit coupled to the first integrated circuit.

18. The system of claim 17 wherein the first and second integrated circuits are disposed on respective dies.

19. The system of claim 17 wherein the first and second integrated circuits are disposed on a same die.

20. The system of claim 17 wherein the second integrated circuit comprises a controller.

21. A method, comprising:
applying a read signal to a memory cell having a charge;
measuring a change in the charge of the memory cell caused by the read signal; and
indicating in response to the change in the charge of the memory cell a value of data stored in the memory cell.

22. The method of claim 21 wherein applying the read signal comprises:
coupling a read voltage to a first input node of an operational amplifier; and
coupling the memory cell to a second input node of the operational amplifier.

23. The method of claim 21 wherein:
measuring a change in the charge of the memory cell comprises collecting with a capacitance an amount of charge substantially equal to the change in the charge; and
indicating a value of data comprises generating a data signal having a level that is related to the amount of charge collected with the capacitance.

24. The method of claim 21 wherein:
measuring a change in the charge of the memory cell comprises collecting with a capacitance an amount of charge substantially equal to the change in the charge; and
indicating a value of data comprises generating a data signal having a level that is related to a voltage across the capacitance.

25. The method of claim 21 wherein:
measuring a change in the charge of the memory cell comprises collecting with a first capacitance an amount of charge substantially equal to a sum of the change in the charge of the memory cell and of a change in a charge of a second capacitance in parallel with the memory cell; and
indicating a value of data comprises generating a data signal having a level that is related to the change in the charge of the memory cell.

* * * * *